(12) United States Patent
Chou

(10) Patent No.: US 8,183,840 B2
(45) Date of Patent: May 22, 2012

(54) VOLTAGE CONVERTER

(75) Inventor: Yi-Chung Chou, Taipei (TW)

(73) Assignee: ITE Tech. Inc., Hsinchu (TW)

( * ) Notice: Subject to any disclaimer, the term of this patent is extended or adjusted under 35 U.S.C. 154(b) by 448 days.

(21) Appl. No.: 12/490,309

(22) Filed: Jun. 23, 2009

(65) Prior Publication Data

US 2010/0271117 A1 Oct. 28, 2010

(30) Foreign Application Priority Data

Apr. 28, 2009 (TW) .............................. 98114048 A

(51) Int. Cl.
*G05F 1/10* (2006.01)
*G05F 1/40* (2006.01)
(52) U.S. Cl. .................. 323/222; 323/284; 327/537
(58) Field of Classification Search .................. 323/222, 323/225, 259, 284, 288, 290, 351; 327/534, 327/535, 537
See application file for complete search history.

(56) References Cited

U.S. PATENT DOCUMENTS

| | | | | |
|---|---|---|---|---|
| 5,998,977 A | * | 12/1999 | Hsu et al. | 323/272 |
| 6,310,466 B1 | * | 10/2001 | Criscione | 323/222 |
| 7,365,522 B2 | * | 4/2008 | Chen et al. | 323/267 |
| 7,486,046 B2 | * | 2/2009 | Chou | 320/107 |
| 2009/0167420 A1 | * | 7/2009 | Nowak | 327/541 |

* cited by examiner

Primary Examiner — Jessica Han

(57) ABSTRACT

A voltage converter including a first transistor, a second transistor, an inductor and a control module is provided. The first transistor has a source terminal receiving an input signal, and a body terminal receiving a first bias voltage. The second transistor has a drain terminal coupled to a drain terminal of the first transistor, a source terminal coupled to ground, and a body terminal receiving a second bias voltage. The inductor has a first terminal coupled to the drain terminal of the first terminal and a second terminal generating an output voltage. The control module is coupled to a gate terminal of the first transistor and a gate terminal of the second transistor for controlling conducting states of the first transistor and the second transistor.

4 Claims, 4 Drawing Sheets

VOLTAGE CONVERTER

CROSS-REFERENCE TO RELATED APPLICATION

This application claims the priority benefit of Taiwan application Ser. No. 98114048, filed on Apr. 28, 2009. The entirety of the above-mentioned patent application is hereby incorporated by reference herein and made a part of specification.

BACKGROUND OF THE INVENTION

1. Field of the Invention

The present invention is related to a voltage converter, and more particularly to a voltage converter for controlling a body forward bias voltage of a transistor.

2. Description of Related Art

Voltage converter is a voltage conversion circuit which utilizes an inductor to perform charging and discharging. The voltage converter not only has a boost converter structure but also has a buck converter and a buck/boost converter structure, and the voltage converter is one of most popular power supply devices.

FIG. 1 is a schematic diagram illustrating a conventional boost voltage converter. Referring to FIG. 1, in a boost voltage converter 100, a body terminal of a PMOS transistor 110 is connected to an output voltage Vout, and a body terminal of a NMOS transistor 120 is connected to ground terminal Gnd.

FIG. 2 is a schematic diagram illustrating a conventional buck voltage converter. Referring to FIG. 2, in a buck voltage converter 200, a body terminal of a PMOS transistor 210 is connected to an input voltage Vin, and a body terminal of a NMOS transistor 220 is connected to the ground terminal Gnd.

FIG. 3 is a schematic diagram illustrating a conventional buck/boost voltage converter. Referring to FIG. 3, in a buck voltage converter 300, body terminals of a PMOS transistor 310 and a PMOS transistor 330 are both connected to an input voltage Vin, and body terminals of a NMOS transistor 320 and a NMOS transistor 340 are both connected to the ground terminal Gnd.

As illustrated in the above-described FIG. 1~FIG. 3, since the body terminal of each of the PMOS transistors is respectively connected to the input voltage Vin or the output voltage Vout (i.e., a highest voltage level), and the body terminals of each of the NMOS transistor are all connected to the ground terminal Gnd (i.e., a lowest voltage level). Therefore, the voltage converters 100~300 are unable to adjust voltages on the body terminals of each of the transistors.

SUMMARY OF THE INVENTION

The present invention provides a voltage converter, by which conducting resistance and occupied area of layout are reduced, whereby further lowers energy loss during conversion of voltages so as to enhance voltage conversion efficiency.

The present invention proposes a voltage converter, including a first transistor, a second transistor, an inductor and a control module. The first transistor has a source terminal receiving an input voltage and a body terminal receiving a first bias voltage. The second transistor has a drain terminal coupled to a drain terminal of the first transistor, a source terminal coupled to a ground terminal, and a body terminal receiving a second bias voltage. The inductor has a first terminal coupled to the drain terminal of the first transistor and a second terminal generating an output voltage. The control module is coupled to a gate terminal of the first transistor and a gate terminal of the second transistor for controlling conducting states of the first transistor and the second transistor.

In an exemplary embodiment of the present invention, the aforementioned voltage converter further includes a first bias voltage adjustment module and a second bias voltage adjustment module. The first bias voltage adjustment module is coupled between the body terminal of the first transistor and the control module, and generates the first bias voltage. The second bias voltage adjustment module is coupled between the body terminal of the second transistor and the control module, and generates the second bias voltage. Wherein, the first bias voltage adjustment module and the second bias voltage adjustment module are controlled by the control module to adjust voltage values of the first bias voltage and the second bias voltage.

In an exemplary embodiment of the present invention, the aforementioned voltage converter further includes a third transistor and a fourth transistor. The third transistor has a source terminal generating a second output voltage, a drain terminal coupled to the second terminal of the inductor, a body terminal receiving a third bias voltage, and a gate terminal is coupled to the control module. The fourth transistor has a drain terminal coupled to the drain terminal of the third transistor, a source terminal coupled to the ground terminal, a body terminal receiving a fourth bias voltage, and a gate terminal coupled to the control module. Wherein, conducting states of the third transistor and the fourth transistor are controlled by the control module.

In an exemplary embodiment of the present invention, the aforementioned voltage converter further includes a third bias voltage adjustment module and a fourth bias voltage adjustment module. The third bias voltage adjustment module is coupled between the body terminal of the third transistor and the control module, and generates the third bias voltage. The fourth bias voltage adjustment module is coupled between the body terminal of the fourth transistor and the control module, and generates the fourth bias voltage. Wherein, the third bias voltage adjustment module and the fourth bias voltage adjustment module are controlled by the control module to adjust voltage values of the third bias voltage and the fourth bias voltage.

The present invention proposes a voltage converter, including the inductor, the first transistor, the second transistor, and the control module. The inductor has a first terminal receiving the input voltage. The first transistor has the source terminal generating an input voltage, the drain terminal coupled to the second terminal of the inductor, and the body terminal receiving the first bias voltage. The second transistor has the drain terminal coupled to the drain terminal of the first transistor, a source terminal coupled to the ground terminal, and a body terminal receiving the second bias voltage. The control module is coupled between the gate terminal of the first transistor and the gate terminal of the second transistor for controlling the conducting states of the first transistor and the second transistor.

In an exemplary embodiment of the present invention, the aforementioned voltage converter further includes the first bias voltage adjustment module and the second bias voltage adjustment module. The first bias voltage adjustment module is coupled between the body terminal of the first transistor and the control module, and generates the first bias voltage. The second bias voltage adjustment module is coupled between the body terminal of the second transistor and the control module, and generates the second bias voltage. Wherein, the first bias voltage adjustment module and the second bias voltage adjustment module are controlled by the control module to adjust voltage values of the first bias voltage and the second bias voltage.

By providing different bias voltages (i.e., the first bias voltage, the second bias voltage, the third bias voltage and the fourth bias voltage) at the body terminal of each transistor of the voltage converter, the present invention effectively reduce the conducting resistance and the occupied area of the layout, further lowering the energy loss during the voltage conversion such that the voltage conversion efficiency is enhanced. In addition, the present invention also adjusts the bias voltage generated by each bias voltage adjustment module through the control module such that the voltage converter may achieve best voltage conversion efficiency at every operating state.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
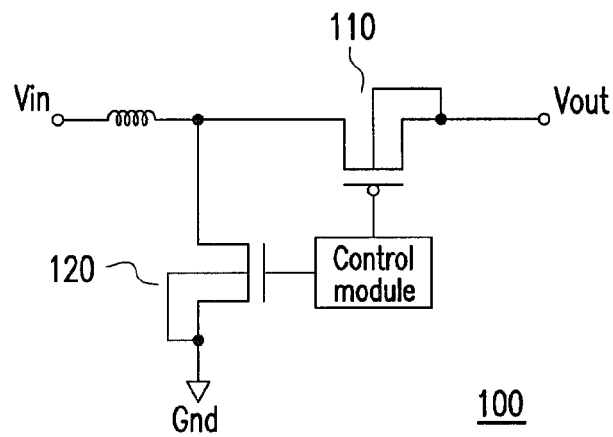
FIG. 1 is a schematic diagram illustrating a conventional boost voltage converter.
Figure 2:
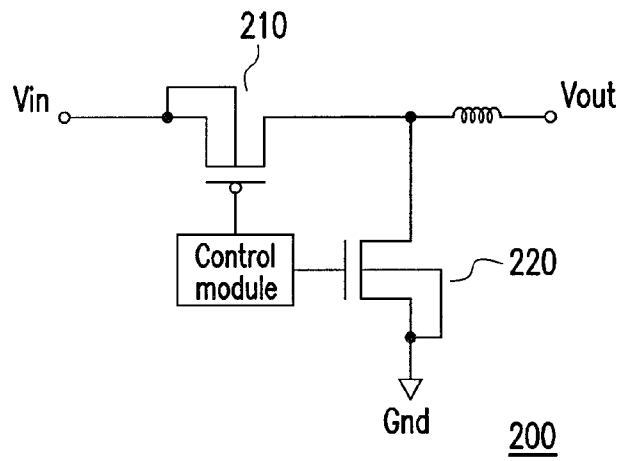
FIG. 2 is a schematic diagram illustrating a conventional buck voltage converter.
Figure 3:
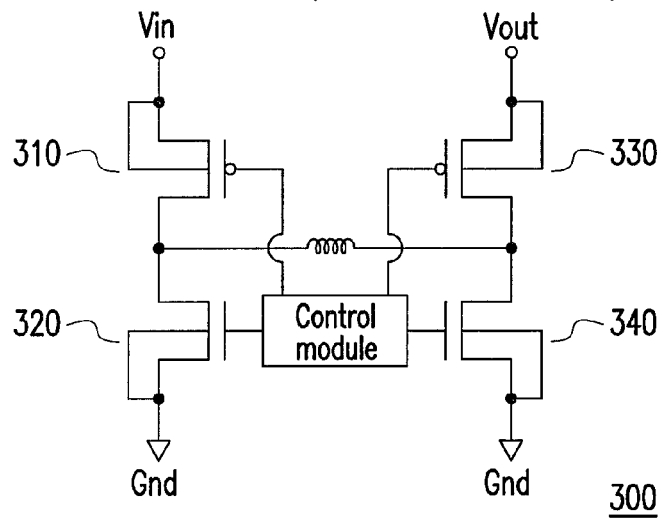
FIG. 3 is a schematic diagram illustrating a conventional buck/boost voltage converter.
Figure 4A:
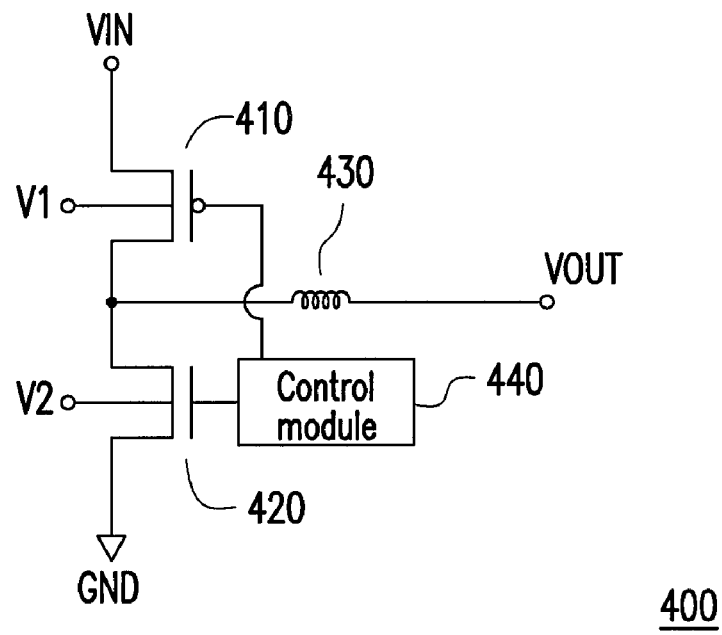
FIG. 4A is a schematic diagram illustrating a voltage converter of an exemplary embodiment of the present invention.

FIG. 4A is a schematic diagram illustrating a voltage converter of an exemplary embodiment of the present invention. Referring to FIG. 4A, the voltage converter 400 includes a first transistor 410, a second transistor 420, an inductor 430 and a control module 440.

A source terminal of the first transistor 410 receives the input voltage VIN, and a body terminal of the first transistor 410 receives a first bias voltage V1. A drain terminal of the second transistor 420 is coupled to the sink terminal of the first transistor 410, a source terminal of the second transistor 420 is coupled to the ground terminal GND, and a body terminal of the second transistor 420 receives a second bias voltage V2. The inductor 430 has a first terminal coupled to the drain terminal of the first transistor 410 and a second terminal generating an output voltage VOUT. The control module 440 is coupled to a gate terminal of the first transistor 410 and a gate terminal of the second transistor 420 for controlling conducting states of the first transistor 410 and the second transistor 420.

In the present embodiment, the first transistor 410 is implemented by a PMOS transistor, and the second transistor 420 is implemented by a NMOS transistor. In an overall operation, the body terminal of the first transistor 410 is not connected to VIN (e.g., a highest voltage level) but receives the first bias voltage V1 (e.g., VIN−ΔV1), whereby lowers a threshold voltage of the first transistor 410, further lowering a conducting resistance of the first transistor 410 and increasing a driving current capability thereof. Wherein, ΔV1 is an adjustable voltage value, and a range of ΔV1 is normally as "ΔV1<0.7V," so as to prevent a leakage current from being generated between the body terminal and the source terminal of the first transistor 410.

Besides, the body terminal of the second transistor (the NMOS transistor) 420 is not connected to the ground terminal GND (e.g., a lowest voltage level), but receives the second bias voltage V2 (e.g., GND+ΔV2), whereby lowers a threshold voltage of the second transistor 420, further lowering a conducting resistance of the second transistor 420 and increasing the driving current capability thereof. Wherein, ΔV2 is the adjustable voltage value, and a range of ΔV2 is normally as "ΔV2<0.7V," so as to prevent a leakage current from being generated between the body terminal and the source terminal of the first transistor 420.

Accordingly, the voltage converter 400 of the present embodiment may effectively lower the conducting resistance of the first transistor 410 and the second transistor 420 and the occupied area of the layout, further lowering energy loss during the voltage conversion such that a voltage conversion efficiency is enhanced.

Figure 4B:
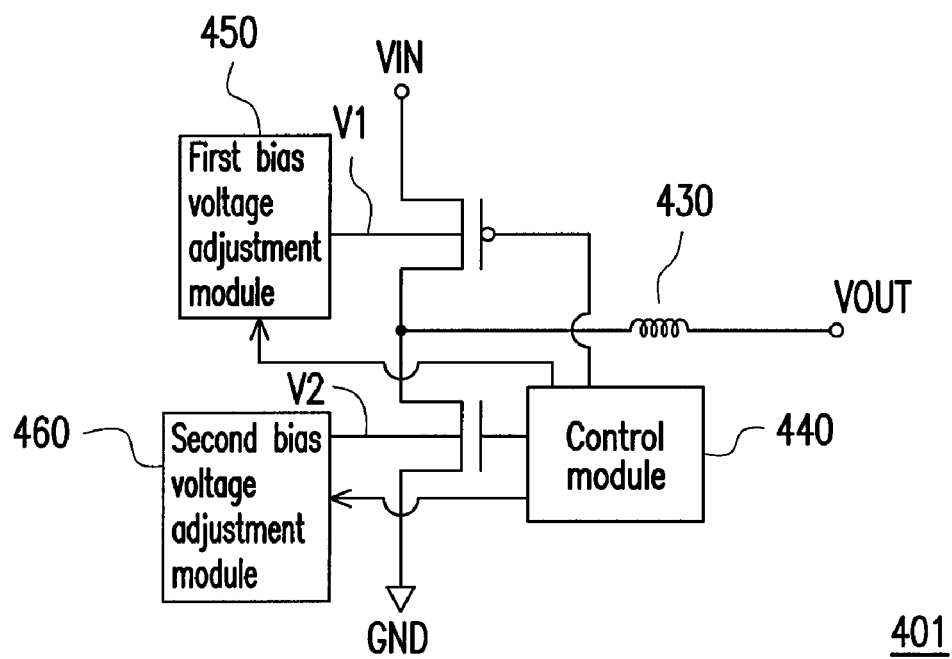
FIG. 4B is a schematic diagram illustrating a voltage converter of an exemplary embodiment of the present invention.

FIG. 4B is a schematic diagram illustrating a voltage converter of an exemplary embodiment of the present invention. An electric circuit framework of FIG. 4B is identical to or similar to an electric circuit framework of FIG. 4A, but a difference therebetween is that the voltage converter 401 also includes a first bias voltage adjustment module 450 and the second bias voltage adjustment module 460, so elements with identical functions in FIG. 4A and FIG. 4B are denoted identical number references, and they will not be described herein.

Referring to FIG. 4B, the first bias voltage adjustment module 450 is coupled between the body terminal of the first transistor 410 and the control module 440, and generates the first bias voltage V1. The second bias voltage adjustment module 460 is coupled between the body terminal of the second transistor 420 and the control module 440, and generates the second bias voltage V2. Wherein, the first bias voltage adjustment module 450 and the second bias voltage adjustment module 460 are controlled by the control module 440 to adjust voltage values of the first bias voltage V1 and the second bias voltage V2.

In the overall operation, when the voltage converter 401 is in a power down mode, the control module 440 may control the first transistor 410 and the second transistor to be in a cut-off state. Then, the control module 440 may control the first bias voltage adjustment module 450 and adjust the voltage value of the first bias voltage V1 to be a voltage value of the input voltage VIN, further provided to the body terminal of the first transistor 410 such that the voltage converter 401 actually achieve a power down function (a voltage value of the output voltage VOUT is zero). In addition, the control module 440 may control the second bias voltage adjustment module 460 and adjust the voltage value of the second bias voltage V2 to be a voltage value of the ground terminal GND, further provided to the body terminal of the second transistor 420 such that a leakage current of the second transistor 420 is lowered.

When the voltage converter 401 is in a power startup mode, the control module 440 may control the first bias voltage adjustment module 450 and adjust the voltage value of the first bias voltage V1 to be the voltage value of the output voltage VOUT, further provided to the body terminal of the first transistor 410 such that the voltage converter 401 may start an operation.

When the voltage converter 401 is in a normal operation mode and is charging the inductor 430, the control module 440 may control the first transistor 410 to be in a conducting state and control the second transistor 420 to be in a cut-off state. Then, the control module 440 may control the first bias voltage adjustment module 450 and adjust the voltage value of the first bias voltage V1 to be the voltage value (VOUT−ΔV2), further provided to the body terminal of the first transistor 410 such that the conducting resistance of the first transistor 410 is lowered. On the other hand, the control module 440 may control the second bias voltage adjustment module 460 and adjust the voltage value of the second bias voltage V2 to be the voltage value of the ground terminal GND, further provided to the body terminal of the second transistor 420 such that a leakage current of the second transistor 420 is lowered. Wherein, ΔV2 is the adjustable voltage value, and the range of ΔV2 is normally as "ΔV2<0.7V".

When the voltage converter 401 is in the normal operation mode and is discharging the inductor 430, the control module 440 may control the first transistor 410 to be in the cut-off state and control the second transistor 420 to be in the conducting state. The control module 440 may control the first bias voltage adjustment module 450 and adjust the voltage value of the first bias voltage V1 to be the voltage value of the input voltage VIN, further provided to the body terminal of the first transistor 410 such that the conducting resistance of the first transistor 410 is lowered. On the other hand, the control module 440 may control the second bias voltage adjustment module 460 and adjust the voltage value of the second bias voltage V2 to be the voltage value of (GND+ΔV1), further provided to the body terminal of the second transistor 420 such that the conducting resistance of the second transistor 420 is lowered. Wherein, ΔV1 is the adjustable voltage value, and the range of ΔV1 is normally as "ΔV1<0.7V."

Accordingly, by the control module 440 dynamically adjusting the voltage values of the first bias voltage V1 and the second bias voltage V2, the voltage converter 401 may achieve best voltage conversion efficiency in every operation state.

Figure 5A:
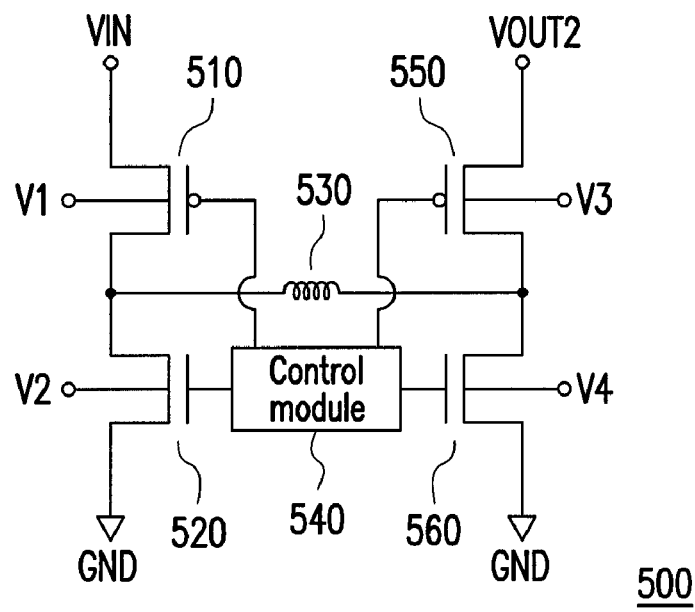
FIG. 5A is a schematic diagram illustrating a voltage converter of an exemplary embodiment of the present invention.

FIG. 5A is a schematic diagram illustrating a voltage converter of an exemplary embodiment of the present invention. Referring to FIG. 5A, the voltage converter includes a first transistor 510, a second transistor 520, an inductor 530, a control module 540, a third transistor 550 and a fourth transistor 560. In the present embodiment, the first transistor 510, the second transistor 520, the inductor 530 and the control module 540 may be referring to related descriptions of the first transistor 410, the second transistor 420, the inductor 430 and the control module 440 in FIG. 4A.

A source terminal of the third transistor 550 generates a second output voltage VOUT2, a drain terminal of the third transistor 550 is coupled to a second terminal of the inductor 530, a body terminal of the third transistor 550 receives a third bias voltage V3, and a gate terminal of the third transistor 550 is coupled to the control module 540. A drain terminal of the fourth transistor 560 is coupled to a drain terminal of the third transistor 550, a source terminal of the fourth transistor 560 is coupled to the ground GND, a body terminal of the fourth transistor 560 receives a fourth bias voltage V4, and a gate terminal of the fourth transistor 560 is coupled to the control module 540. Wherein, the conducting states of the third transistor 550 and the fourth transistor 560 are controlled by the control module 540.

In the present embodiment, the first transistor 510 and the third transistor 550 are implemented by the PMOS transistor; the second transistor 520 and the fourth transistor 560 are implemented by NMOS transistors. In the overall operation, body terminals of the first transistor 510 and the third transistor 550 are not respectively connected to the input voltage VIN and the second output voltage VOUT2, but respectively receives the first bias voltage V1 (e.g., VIN−ΔV1) and the third bias voltage V3 (e.g., VOUT2−ΔV2), whereby lowering the threshold voltages of the first transistor 510 and the third transistor 550, further lowering the conducting resistance of the first transistor 510 and the third transistor 550 and increasing the driving current capability. Wherein, ΔV1 and ΔV2 are the adjustable voltage values, a range of ΔV1 is normally as "ΔV1<0.7V," and a range of ΔV2 is normally as "ΔV2<0.7V," so as to prevent that leakage currents from being generated between the body terminals and the source terminals of the first transistor 510 and the third transistor 550.

In addition, the body terminals of the second transistor 520 and the fourth transistor 560 are not connected to the ground terminal GND, but respectively receives the second bias voltage V2 (e.g., GND+ΔV3) and a fourth bias voltage V4 (e.g., GND+ΔV4), whereby lowering the threshold voltages of the second transistor 520 and the fourth transistor 560, further lowering the conducting resistances of the second transistor 520 and the fourth transistor 560, and increasing the driving current capability. Wherein, ΔV3 and ΔV4 are the adjustable voltage values, a range of ΔV3 is normally as "ΔV3<0.7V," and a range of ΔV4 is normally as "ΔV4<0.7V," so as to prevent leakage currents from being generated between the body terminals- and the source terminals of the second transistor 520 and the fourth transistor 560 are avoided.

Accordingly, the voltage converter 500 of the present embodiment may effectively lower the conducting resistances of the first transistor 510 and the second transistor 520 and the occupied area of the layout, further lowering the energy loss during the voltage conversion such that the voltage conversion efficiency is enhanced.

Figure 5B:
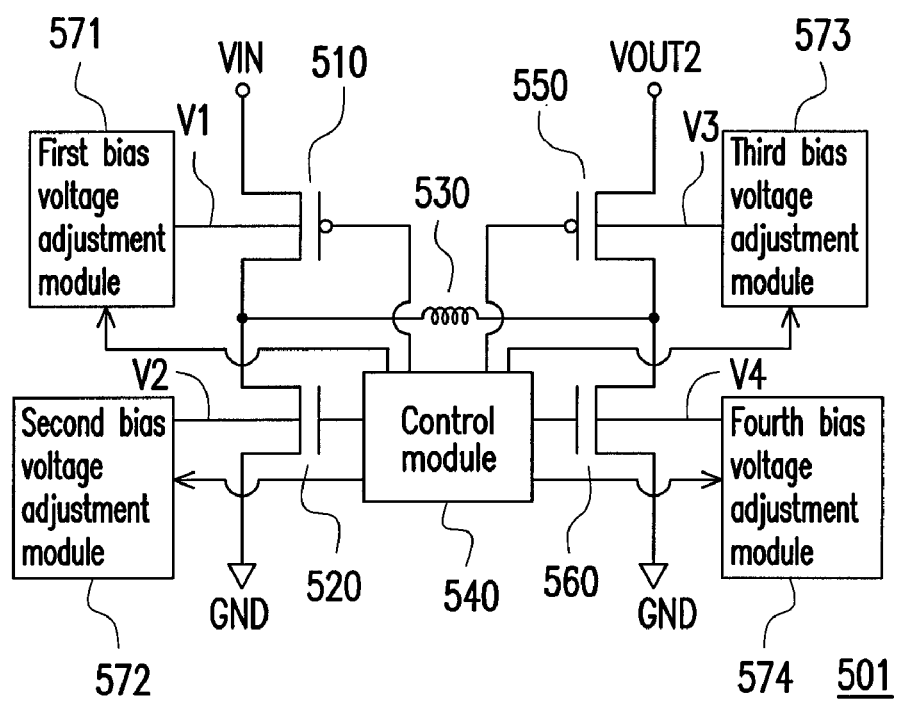
FIG. 5B is a schematic diagram illustrating a voltage converter of an exemplary embodiment of the present invention.

FIG. 5B is a schematic diagram illustrating a voltage converter of an exemplary embodiment of the present invention. An electric circuit framework of FIG. 5B is identical to or similar to an electric circuit framework of FIG. 5A, but a difference therebetween is that the voltage converter 501 also includes a first bias voltage adjustment module 571, the second bias voltage adjustment module 572, the third bias voltage adjustment module 573 and the fourth bias voltage adjustment module 574, so elements with identical functions in FIG. 5A and FIG. 5B are denoted identical number references, and they will not be described herein. In addition, the first bias voltage adjustment module 571 and the second bias voltage adjustment module 572 may be referring to the related descriptions of the first bias voltage adjustment module 450 and the second bias voltage adjustment module 460 in FIG. 4A.

Referring to FIG. 5B, the third bias voltage adjustment module 573 is coupled between the body terminal of the third transistor 550 and the control module 540, and generates the third bias voltage V3. The fourth bias voltage adjustment module 574 is coupled between the body terminal of the fourth transistor 560 and the control module 540, and generates the fourth bias voltage V4. Wherein, the third bias voltage adjustment module 573 and the fourth bias voltage adjustment module 574 are controlled by the control module 540 to adjust voltage values of the third bias voltage V3 and the fourth bias voltage V4.

In the overall operation, when the voltage converter 501 is in the power down mode, the control module 540 may control the first transistor 510, the second transistor, the third transistor 550 and the fourth transistor 560 to be in a cut-off state. Then, the control module 540 may control the first bias voltage adjustment module 571 and the third bias voltage adjustment module 573, and adjust the voltage values of the first bias voltage V1 and the third bias voltage V3 to be the voltage value of the input voltage VIN, further and respectively provided to the body terminal of the first transistor 510 and the body terminal of the third transistor 550, such that the voltage converter 501 actually achieves the power down function. On the other hand, the control module 540 may control the second bias voltage adjustment module 572 and the fourth bias voltage adjustment module 574, and adjust the voltage values of the second bias voltage V2 and the fourth bias voltage V4 to be the voltage value of the ground terminal GND, further and respectively provided to the body terminal of the second transistor 520 and the body terminal of the fourth transistor 560, such that leakage currents of the second transistor 520 and the fourth transistor 560 are lowered.

When the voltage converter 501 is in the power startup mode, the control module 540 may control the first bias voltage adjustment module 571 and the third bias voltage adjustment module 573, and adjust the voltage values of the first bias voltage V1 and the third bias voltage V3 to be the voltage value of the second output voltage VOUT2, further and respectively provided to the body terminal of the first transistor 510 and the body terminal of the third transistor 550, such that the voltage converter 501 starts the operations.

When the voltage converter 501 is in the normal operation mode and is charging the inductor 530, the control module 540 may control the first transistor 510 and the fourth transistor 560 to be in the conducting state, and control the second transistor 520 and the third transistor 550 to be in the cut-off state. Then, the control module 540 may control the first bias voltage adjustment module 571 and adjust the voltage value of the first bias voltage V1 to be the voltage value of (VOUT2−ΔV2), further provided to the body terminal of the first transistor 510 such that the conducting resistance of the first transistor 510 is lowered. The control module 540 may control the second bias voltage adjustment module 572 and adjust the voltage value of the second bias voltage V2 to be the voltage value of the ground terminal GND, further provided to the body terminal of the second transistor 520 such that a leakage current of the second transistor 520 is lowered. Wherein, ΔV2 is the adjustable voltage value, and the range of ΔV2 is normally as "ΔV2<0.7V."

The control module 540 may control the third bias voltage adjustment module 573 and adjust the voltage value of the third bias voltage V3 to be the voltage value of the second output voltage VOUT2, further provided to the body terminal of the first transistor 550 such that the leakage current of the third transistor 550 is lowered. The control module 540 may control the fourth bias voltage adjustment module 574 and adjust the voltage value of the fourth bias voltage V4 to be the voltage value of (GND+ΔV1), further provided to the body terminal of the fourth transistor 560 such that the leakage current of the fourth transistor 560 is lowered. Wherein, ΔV1 is the adjustable voltage value, and the range of ΔV1 is normally as "ΔV1<0.7V."

When the voltage converter 501 is in the normal operation mode and is discharging the inductor 530, the control module 540 may control the first transistor 510 and the fourth transistor 560 to be in the cut-off state, and control the second transistor 520 and the third transistor 550 to be in the conducting state. Then, the control module 540 may control the first bias voltage adjustment module 571 and adjust the voltage value of the first bias voltage V1 to be the voltage value of the input voltage VIN, further provided to the body terminal of the first transistor 510 such that the leakage current of the first transistor 510 is lowered. The control module 540 may control the second bias voltage adjustment module 572 and adjust the voltage value of the second bias voltage V2 to be the voltage value of (GND+ΔV1), further provided to the body terminal of the second transistor 520 such that the leakage current of the second transistor 520 is lowered.

The control module 540 may control the third bias voltage adjustment module 573 and adjust the voltage value of the third bias voltage V3 to be the voltage value of (VOUT2−ΔV2), further provided to the body terminal of the third transistor 550 such that the conducting resistance of the third transistor 550 is lowered. The control module 540 may control the fourth bias voltage adjustment module 574 and adjust the voltage value of the fourth bias voltage V4 to be the voltage value of the ground terminal GND, further provided to the body terminal of the fourth transistor 560 such that the leakage current of the fourth transistor 560 is lowered.

When the voltage converter 501 operates in an upper freewheel mode, the control module 540 may control the first transistor 510 and the third transistor 550 to be in the conducting state, and control the second transistor 520 and the fourth transistor 560 to be in the cut-off state. Then, the control module 540 may control the first bias voltage adjustment module 571 and adjust the voltage value of the first bias voltage V1 to be the voltage value of (VIN−ΔV2), further provided to the body terminal of the first transistor 510 such that the conducting resistance of the first transistor 510 is lowered. The control module 540 may control the second bias voltage adjustment module 572 and adjust the voltage value of the second bias voltage V2 to be the voltage value of the ground terminal GND, further provided to the body terminal of the second transistor 520 such that the leakage current of the second transistor 520 is lowered.

The control module 540 may control the third bias voltage adjustment module 573 and adjust the voltage value of the third bias voltage V3 to be the voltage value of (VOUT2−ΔV2), further provided to the body terminal of the third transistor 550 such that the conducting resistance of the third transistor 550 is lowered. The control module 540 may control the fourth bias voltage adjustment module 574 and adjust the voltage value of the fourth bias voltage V4 to be the voltage value of the ground terminal GND, further provided to the body terminal of the fourth transistor 560 such that the leakage current of the fourth transistor 560 is lowered.

In addition, when the voltage converter 501 operates in the upper freewheel mode and makes the voltages on two terminals of the inductor 530 the same, voltage values of the input voltage VIN and the second output voltage VOUT2 may be set as the same.

When the voltage converter 501 operates in a lower freewheel mode and makes the voltages on the two terminals of the inductor 530 the same, the control module 540 may control the first transistor 510 and the third transistor 550 to be in the cut-off state, and control the second transistor 520 and the fourth transistor 560 to be in the conducting state. Then, the control module 540 may control the first bias voltage adjustment module 571 and adjust the voltage value of the first bias voltage V1 to be the voltage value of the input voltage VIN, further provided to the body terminal of the first transistor 510 such that the leakage current of the first transistor 510 is lowered. The control module 540 may control the second bias voltage adjustment module 572 and adjust the voltage value of the second bias voltage V2 to be the voltage value of (GND+ΔV1), further provided to the body terminal of the second transistor 520 such that the leakage current of the second transistor 520 is lowered.

The control module 540 may control the third bias voltage adjustment module 573 and adjust the third bias voltage V3 to be the voltage value of the second output voltage VOUT2, further provided to the body terminal of the third transistor 550 such that the leakage current of the third transistor 550 is lowered. The control module 540 may control the fourth bias voltage adjustment module 574 and adjust the voltage value of the fourth bias voltage V4 to be the voltage value of (GND+ΔV1), further provided to the body terminal of the fourth transistor 560 such that the conducting resistance of the fourth transistor 560 is lowered.

Accordingly, by the control module 540 dynamically adjusting the voltage values of the first bias voltage V1, the second bias voltage V2, the third bias voltage V3, and the fourth bias voltage V4, the voltage converter 501 may achieve the best voltage conversion efficiency in every operation state.

FIG. 6 is a schematic diagram illustrating a voltage converter of an exemplary embodiment of the present invention. Referring to FIG. 6, the voltage converter 600 includes an inductor 610, a first transistor 620, a second transistor 630 and a control module 640.

The inductor 610 has a first terminal receiving the input voltage VIN. A source terminal of the first transistor 620 generates the output voltage VOUT, a drain terminal of the first transistor 620 is coupled to a second terminal of the inductor 610, and a body terminal of the first transistor 620 receives the first bias voltage V1. A drain terminal of the second transistor 630 is coupled to the drain terminal of the first transistor 620, a source terminal of the second transistor 630 is coupled to the ground terminal GND, and a body terminal of the second transistor 630 receives the second bias voltage V2. The control module 640 is coupled to a gate terminal of the first transistor 620 and a gate terminal of the second transistor 630 for controlling conducting states of the first transistor 620 and the second transistor 630.

In the present embodiment, the first transistor 620 is implemented by the PMOS transistor, and the second transistor 630 is implemented by the NMOS transistor. In an overall operation, the body terminal of the first transistor 620 is not connected to the output voltage VOUT (e.g., the highest voltage level) but receives the first bias voltage V1 (e.g., VOUT−ΔV1), whereby lowers a threshold voltage of the first transistor 620, further reducing a conducting resistance of the first transistor 620 and increasing the driving current capability thereof. Wherein, ΔV1 is the adjustable voltage value, and the range of ΔV1 is normally as "ΔV1<0.7V," so as to prevent a leakage current from being generated between the body terminal and the source terminal of the first transistor 620 is avoided.

Besides, the body terminal of the second transistor 630 is not connected to the ground terminal GND (e.g., the lowest voltage level), but receives the second bias voltage V2 (e.g., GND+ΔV2), whereby lowers a threshold voltage of the second transistor 630, further reducing a conducting resistance of the second transistor 630 and increasing the driving current capability thereof. Wherein, ΔV2 is the adjustable voltage value, and the range of ΔV2 is normally as "ΔV2<0.7V," so as to prevent a leakage current from being generated between the body terminal and the source terminal of the first transistor 630 is avoided.

Accordingly, the voltage converter 600 of the present embodiment may effectively lower the conducting resistances of the first transistor 620 and the second transistor 630 and the occupied area of the layout, further lowering the energy loss during the voltage conversion such that a voltage conversion efficiency is enhanced.

Figure 6A:
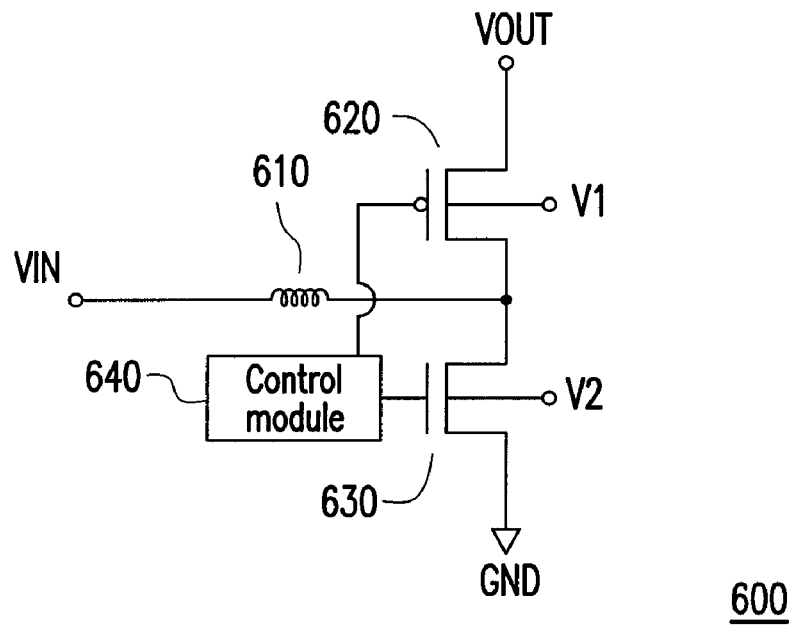
FIG. 6A is a schematic diagram illustrating a voltage converter of an exemplary embodiment of the present invention.
Figure 6B:
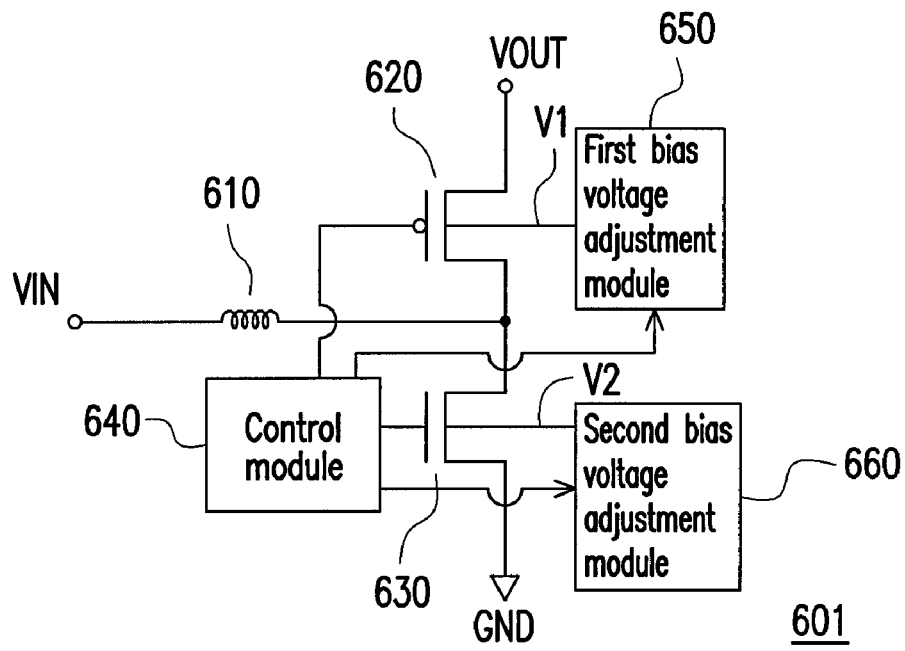
FIG. 6B is a schematic diagram illustrating a voltage converter of an exemplary embodiment of the present invention.

FIG. 6B is a schematic diagram illustrating a voltage converter of an exemplary embodiment of the present invention. An electric circuit framework of FIG. 6B is identical to or similar to an electric circuit framework of FIG. 6A, but a difference therebetween is that the voltage converter 601 also includes a first bias voltage adjustment module 650 and a second bias voltage adjustment module 660, so elements with identical functions in FIG. 6A and FIG. 6B are denoted identical number references, and they will not be described herein.

Referring to FIG. 6B, the first bias voltage adjustment module 650 is coupled between the body terminal of the first transistor 620 and the control module 640, and generates the first bias voltage V1. The second bias voltage adjustment module 660 is coupled between the body terminal of the second transistor 630 and the control module 640, and generates the second bias voltage V2. Wherein, the first bias voltage adjustment module 650 and the second bias voltage adjustment module 660 are controlled by the control module 640 to adjust voltage values of the first bias voltage V1 and the second bias voltage V2.

In the overall operation, when the voltage converter 601 is in the power down mode, the control module 640 may control the first transistor 620 and the second transistor to be in the cut-off state. Then, the control module 640 may control the first bias voltage adjustment module 650 and adjust the voltage value of the first bias voltage V1 to be a voltage value of the input voltage VIN, further provided to the body terminal of the first transistor 620 such that the voltage converter 601 actually achieve the power down function (the voltage value of the output voltage VOUT is zero). On the other hand, the control module 640 may control the second bias voltage adjustment module 660 and adjust the voltage value of the second bias voltage V2 to be the voltage value of the ground terminal GND, further provided to the body terminal of the second transistor 630 such that the leakage current of the second transistor 630 is lowered.

When the voltage converter 601 is in the power startup mode, the control module 640 may control the first bias voltage adjustment module 650 and adjust the voltage value of the first bias voltage V1 to be the voltage value of the output voltage VOUT, further provided to the body terminal of the first transistor 620 such that the voltage converter 601 may achieve the startup operation.

When the voltage converter 601 is in the normal operation mode and is charging the inductor 610, the control module 640 may control the first transistor 620 to be in the cut-off state and control the second transistor 630 is controlled to be in the conducting state. Then, the control module 640 may control the first bias voltage adjustment module 650 and adjust the voltage value of the first bias voltage V1 to be the voltage value of the output voltage VOUT, further provided to the body terminal of the first transistor 620 such that the leakage current of the first transistor 620 is lowered. On the other hand, the control module 640 may control the second bias voltage adjustment module 660 and adjust the voltage value of the second bias voltage V2 to be the voltage value of (GND+ΔV1), further provided to the body terminal of the second transistor 630 such that the conducting resistance of the second transistor 630 is lowered. Wherein, ΔV1 is the adjustable voltage value, and the range of ΔV1 is normally as "ΔV1<0.7V."

When the voltage converter 601 is in the normal operation mode and is discharging the inductor 610, the control module 640 may control the first transistor 620 to be in the conducting state and control the second transistor 630 to be in the cut-off state. Then, the control module 640 may control the first bias voltage adjustment module 650 and adjust the voltage value of the first bias voltage V1 to be the voltage value of the output voltage (VOUT−ΔV2), further provided to the body terminal of the first transistor 620 such that the leakage current of the first transistor 620 is lowered. On the other hand, the control module 640 may control the second bias voltage adjustment module 660 and adjust the voltage value of the second bias voltage V2 to be the voltage value of the ground terminal GND, further provided to the body terminal of the second transistor 630 such that the conducting resistance of the second transistor 630 is lowered. Wherein, ΔV2 is the adjustable voltage value, and the range of ΔV2 is normally as "ΔV2<0.7V."

Accordingly, by the control module 640 dynamically adjusting the voltage values of the first bias voltage V1 and the second bias voltage V2, the voltage converter 601 may achieve best voltage conversion efficiency in every operation state.

In summary, by providing different bias voltages (i.e., the first bias voltage, the second bias voltage, the third bias voltage and the fourth bias voltage) at the body terminal of each transistor of the voltage converter, the present invention effectively reduce the conducting resistance and the occupied area of the layout, further lowering the energy loss during the voltage conversion such that the voltage conversion efficiency is enhanced. In addition, each of the embodiments mentioned previously may also control the bias voltage generated by each of the bias voltage adjustment modules through the control module such that the voltage converter may achieve the best voltage conversion efficiency at every operating state.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A voltage converter, comprising:
    a first transistor, wherein a source terminal of the first transistor receives an input voltage, and a body terminal of the first transistor receives a first bias voltage;
    a second transistor, wherein the drain terminal of the second transistor is coupled to a drain terminal of the first transistor, a source terminal of the second transistor is coupled to a ground terminal, and a body terminal of the second transistor receives a second bias voltage;
    an inductor, wherein a first terminal of the conductor is coupled to the drain terminal of the first transistor, and a second terminal of the conductor generates an output voltage;
    a control module, coupled to a gate terminal of the first transistor and a gate terminal of the second transistor for controlling conducting states of the first transistor and the second transistor;
    a first bias voltage adjustment module, coupled between the body terminal of the first transistor and the control module and generating a first bias voltage; and
    a second bias voltage adjustment module, coupled between the body terminal of the second transistor and the control module and generating a second bias voltage, wherein the first bias voltage adjustment module and the second bias voltage adjustment module are controlled by the control module to adjust voltage values of the first bias voltage and the second bias voltage.

2. A voltage converter, comprising:
    a first transistor, wherein a source terminal of the first transistor receives an input voltage, and a body terminal of the first transistor receives a first bias voltage;
    a second transistor, wherein the drain terminal of the second transistor is coupled to a drain terminal of the first transistor, a source terminal of the second transistor is coupled to a ground terminal, and a body terminal of the second transistor receives a second bias voltage;
    an inductor, wherein a first terminal of the conductor is coupled to the drain terminal of the first transistor, and a second terminal of the conductor generates an output voltage;
    a control module, coupled to a gate terminal of the first transistor and a gate terminal of the second transistor for controlling conducting states of the first transistor and the second transistor;
    a third transistor, wherein a source terminal of the third transistor generates a second output voltage, a drain terminal of the third transistor is coupled to the second terminal of the inductor, a body terminal of the third transistor receives a third bias voltage, and a gate terminal of the third transistor is coupled to the control module; and
    a fourth transistor, wherein a drain terminal of the fourth transistor is coupled to the drain terminal of the third transistor, a source terminal of the fourth transistor is coupled to the ground terminal, a body terminal of the fourth transistor receives a fourth bias voltage, and a gate terminal of the fourth transistor is coupled to the control module,
    wherein conducting states of the third transistor and the fourth transistor are controlled by the control module.

3. The voltage converter as claimed in claim 2, further comprising:
    a first bias voltage adjustment module, coupled between the body terminal of the first transistor and the control module and generating the first bias voltage;
    a second bias voltage adjustment module, coupled between the body terminal of the second transistor and the control module and generating the second bias voltage;
    a third bias voltage adjustment module, coupled between the body terminal of the third transistor and the control module and generating the third bias voltage; and
    a fourth bias voltage adjustment module, coupled between the body terminal of the fourth transistor and the control module and generating the fourth bias voltage,
    wherein the first bias voltage adjustment module, the second bias voltage adjustment module, the third bias voltage adjustment module, and the fourth bias voltage adjustment module are controlled by the control modules to adjust voltage values of the first bias voltage, the second bias voltage, the third bias voltage, and the fourth bias voltage.

4. A voltage converter, comprising:

an inductor, wherein a first terminal of the inductor receives an input voltage;

a first transistor, wherein a source terminal of the first transistor generates an output voltage, a drain terminal of the first transistor is coupled to a second terminal of the inductor, and a body terminal of the first transistor receives a first bias voltage;

a second transistor, wherein a drain terminal of the second transistor is coupled to the drain terminal of the first transistor, a source terminal of the second transistor is coupled to a ground terminal, and a body terminal of the second transistor receives a second bias voltage;

a control module, coupled to a gate terminal of the first transistor and a gate terminal of the second transistor for controlling conducting states of the first transistor and the second transistor;

a first bias voltage adjustment module, coupled between the body terminal of the first transistor and the control module and generating a first bias voltage; and a second bias voltage adjustment module, coupled between the body terminal of the second transistor and the control module and generating a second bias voltage, wherein the first bias voltage adjustment module and the second bias voltage adjustment module are controlled by the control module to adjust voltage values of the first bias voltage and the second bias voltage.

\* \* \* \* \*